United States Patent

[11] 3,566,220

[72] Inventor Simon D. Post
Clearwater, Fla.
[21] Appl. No. 819,368
[22] Filed Apr. 25, 1969
Division of Ser. No. 560,158, June 24, 1966, abandoned.
[45] Patented Feb. 23, 1971
[73] Assignee Texas Instruments Incorporated
Dallas, Tex.

[54] INTEGRATED SEMICONDUCTOR CIRCUIT HAVING COMPLEMENTARY TRANSISTORS PROVIDED WITH DIELECTRIC ISOLATION AND SURFACE COLLECTOR CONTACTS
3 Claims, 11 Drawing Figs.

[52] U.S. Cl. 317/235, 317/234, 148/175
[51] Int. Cl. H01l 11/00, H01l 15/00
[50] Field of Search 317/234, 235, 22, 22.1, 22.11; 148/1.5, 174, 175

[56] References Cited

UNITED STATES PATENTS

| | | | |
|---|---|---|---|
| 3,320,485 | 5/1967 | Buie | 317/235 |
| 3,327,182 | 6/1967 | Kisinko | 317/235 |
| 3,412,295 | 11/1968 | Grebene | 317/235 |
| 3,423,255 | 1/1969 | Joyce | 317/235 |
| 3,426,254 | 2/1969 | Bouchard | 317/235 |

*Primary Examiner*—John W. Huckert
*Assistant Examiner*—Andrew J. James
*Attorneys*—Samuel M. Mims, Jr., James O. Dixon, Andrew M. Hassell, Harold Levine, Melvin Sharp, John E. Vandigriff and John M. Harrison

ABSTRACT: An integrated semiconductor circuit wherein the functional electronic components are separated by dielectric isolation and is provided with complementary transistors, each having a buried heavily doped collector contact region extending to the upper surface of the semiconductor slice. The structure provides each transistor with a low collector saturation resistance, and permits all ohmic contacts to be made at the same surface of the slice.

Figure 1:
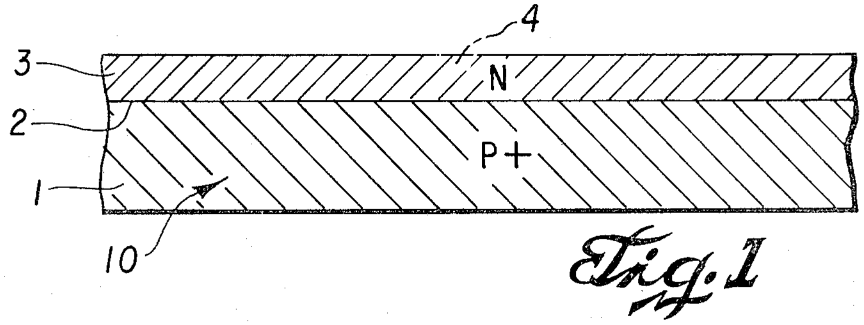

INVENTOR
SIMON D. POST

BY John E. Vandigriff
ATTORNEY

INTEGRATED SEMICONDUCTOR CIRCUIT HAVING COMPLEMENTARY TRANSISTORS PROVIDED WITH DIELECTRIC ISOLATION AND SURFACE COLLECTOR CONTACTS

This application is a division of copending application Ser. No. 560,158 filed June 24, 1966, and now abandoned.

This invention relates to integrated circuits and, more particularly, to miniature electronic circuits of the type having all of the necessary circuit components joined together by a common substrate but yet electrically isolated through the substrate.

There is a substantial growth of interest in microminiaturization at the present time, especially in that area of electronics commonly referred to as "microelectronics." Within the semiconductor field in particular, this interest has been reflected by the rapid development of integrated circuitry. Generally speaking, the area of integrated circuits may be resolved into broad classes. The first is referred to as the "chip approach" wherein individual components such as transistors, resistors, and diodes, are formed on separate pieces of semiconductor material, the separate components thereafter being mounted on an insulating substrate and interconnected in a single package to produce a circuit function. The second class, by far having the greatest potential in microelectronics due to the greater reliability in performance and substantial savings in cost and space, involves having all of the individual active and/or passive components formed on a single piece of semiconductor material, preferably a single crystal, the components being interconnected to perform the desired circuit function.

The formation of all components in one single crystal semiconductor substrate, however, presents the problem of electrically isolating the circuit components from one another. In particular, when a number of transistors are formed within one portion of the substrate, with the substrate forming the collector region, it is necessary in many circuit applications to isolate the transistors to avoid having the collectors commoned. In the "chip approach" isolation is achieved by separating the devices mechanically, but where all the components of a particular circuit are within one semiconductor substrate, achieving adequate isolation is one of the principal problems.

Many techniques have been developed to solve this problem, all of them possessing certain disadvantages. One such process involves producing a series of islands of one conductivity type semiconductor material within a substrate of opposite conductivity type material, and biasing the substrate with respect to the rest of the circuit so that the junctions separating the islands from the substrate area are never forward biased. The islands form the collector regions of transistors, and subsequent diffusions are made into the islands to form the base and emitter regions. Chief among the problems associated with this technique, however, is the fact that the inherent capacitance of the isolation junctions produces undesirable coupling at high frequencies. Also, the circuits and biasing levels must be designed so as to insure that the isolation junctions are not forward biased at any time under normal operating conditions. Even if the junctions are maintained in a reverse biased condition, undesirable effects can result from the collection of carriers by the isolation junction.

Another technique for isolation involves having the isolation islands, in which the components are subsequently constructed, consist of the original wafer doping. Isolation is then achieved by selective diffusion of material of opposite conductivity type from each side of the wafer and completely through the wafer so that the diffusion fronts intersect. A disadvantage of this process is that the diffusions through the wafer require thin wafers and long diffusion times with high surface concentrations, resulting in high isolation capacitance.

There is presently known in the art a method of isolation referred to as "insulated isolation" which partially solves the above-mentioned problems. In accordance with this method, a series of mesas are etched upon one face of a monocrystalline semiconductor wafer. These mesas are then coated with an insulating medium, such as silicon oxide, and a thick layer of semiconductor material is subsequently grown over the top of the wafer so as to completely cover the oxide. The semiconductor wafer, which forms the substrate, is then removed by lapping, leaving only the previous mesa regions which now become isolated pockets supported by the grown semiconductor layer but isolated therefrom by the insulating material. Circuit elements such as transistors, resistors, or other appropriate devices are then formed in the unremoved monocrystalline portion of the pockets by the usual techniques, and will be electrically isolated from each other by the silicon oxide insulating medium. Although the process, as a whole, has proven to possess substantial advantages over other methods of isolation, problems are involved when the circuit elements to be formed are active devices. In particular, since the collector region of a transistor, being the unremoved portion of the monocrystalline substrate, is directly adjacent the insulating medium, subsequent electrical contact to be made to this region may conveniently be made only at the surface of the wafer. This restriction means that all the collector current must flow laterally through the lightly doped collector region to the collector contact made in the surface, and a very large collector spreading resistance is consequently added.

To overcome this difficulty, it has been found that if a layer of high conductivity semiconductive material is located intermediate the collector region and the insulating medium, the collector current flow, particularly in the lateral direction, will encounter less opposition, the collector spreading resistance thereby being lowered. In accordance with this objective, therefore, it has been the practice to incorporate an extra step in the "insulated isolation" technique previously described, the slice of original monocrystalline material being initially subjected to a diffusion operation to produce a shallow low resistive semiconductive region. The mesas are then etched, and the insulating medium and thick layer of semiconductor material formed as before. The difficulty with this approach, however, is encountered when it is desired to provide in the same wafer transistors of both NPN and PNP types. If the substrate is N−type with an N+ region thereon, NPN transistors with a buried N+ layer will result, but PNP cannot be readily provided. PNP structures can be produced by selective etch and redeposit steps introduced prior to the mesa-etching step, but this is a rather complex process and fixes the format or layout early in the manufacturing operation, leaving little flexibility in using a given slice layout for more than one circuit. It is usually necessary to provide buried heavily-doped regions, whether PNP or NPN devices are used, and this further complicates the formation of composite structures having both types of transistors.

With these difficulties in mind, it is the principal object of this invention to provide an improved method of isolation whereby all of the necessary circuit components of an integrated circuit are joined by a common substrate and yet are electrically isolated through the substrate, and particularly to provide for formation of complementary, i.e., PNP and NPN, devices in such a structure while maintaining flexibility in choosing the circuit layout until a late stage in manufacture and at the same time permitting the use of a buried, heavily-doped layer for both PNP and NPN devices to provide low collector saturation resistance.

It is a further object of the invention to provide a method of forming isolated pockets of semiconductor material in the production of integrated circuits such that the isolated pockets of semiconductor material are formed by the same process thereby to be subsequently formed into complementary components.

It is a still further object of the invention to form said high conductivity semiconductor region in a manner such that ohmic contact may be made to said region at the surface of the semiconductor wafer without the requirement of an extra diffusion step.

In accordance with these objects and other objects, features, and improvements to be described subsequently, the invention involves an improved method of isolation utilizing the broad concept of "insulated isolation" but eliminating the shortcomings that limit its use. Accordingly, in a preferred embodiment of this invention, a series of mesas are initially etched on the face of a layer of low conductivity semiconductor material, of one type which had been epitaxially deposited on a high conductivity substrate of opposite type. These means are then coated with an insulating medium, such as silicon oxide, for example, and a thick layer of semiconductor material subsequently grown over the surface of the wafer so as to completely cover the oxide. A substantial portion of the substrate is then removed by lapping. The entire wafer is thereafter inverted, and an oxide is formed upon the lapped surface of the wafer. Using conventional photographic masking and etching techniques, the oxide is selectively removed so as to expose portions of the high conductivity material in the newly formed pockets.

To form components of one kind, for example, PNP transistors, portions of the opposite type high conductivity material is removed. Low conductivity semiconductor material of the opposite conductivity type is redeposited within the removed portions. Components of complementary kind, for example, NPN transistors, are formed by removing potions of both the high conductivity material and the underlying low conductivity material. A layer of high conductivity semiconductor material of the same one type is redeposited within each removed portion. Finally, low conductivity semiconductor material of the same one type is deposited to completely refill the removed portions. Into the low conductivity semiconductor material subsequent diffusions may be made or epitaxial depositions carried out to form diode or transistor structures, for example. Since the low conductivity layer which constitutes the collection collector region in a transistor, is formed by selective vapor etch and epitaxial deposition rather than by lapping, close control may be maintained over its s dimensions. In addition, using the process of this invention, contact may be made directly to the said high conductivity material at the surface of the wafer without the requirement of an extra diffusion step.

It should be apparent that by depositing a low conductivity semiconductor layer of one type adjacent the opposite type high conductivity semiconductor substrate prior to forming the insulating layer, the wafer does not have to be committed to which areas of the wafer will be subsequently formed into NPN and PNP components until the actual semiconductor regions of each component are to be formed. This is due to the approach of having an underlying low conductivity semiconductor material of one type adjacent the overlying opposite type high conductivity material in each insulated pocket of the wafer. This technique surmounts the problem inherent in attempting to grow a high conductivity collector contact region on top of a high conductivity region of opposite type. Such an attempt would tend to result in out diffusion of impurities from the substrate, tending to compensate the grown region and render it a low conductivity region instead.

The novel features believed to be characteristic of this invention are set forth with particularity in the appended claims. The invention itself, however, as well as further objects and advantages thereof, may best be understood by reference to the following detailed description of illustrative embodiments, when read in conjunction with the accompanying drawings, wherein:

FIGS. 1—4 are sectional views of a semiconductor wafer showing the pocket formation stages of the process of this invention;

FIGS. 5—10 are sectional views of a semiconductor wafer showing the final etch, deposition, and diffusion stages of this invention.

Figure 11:
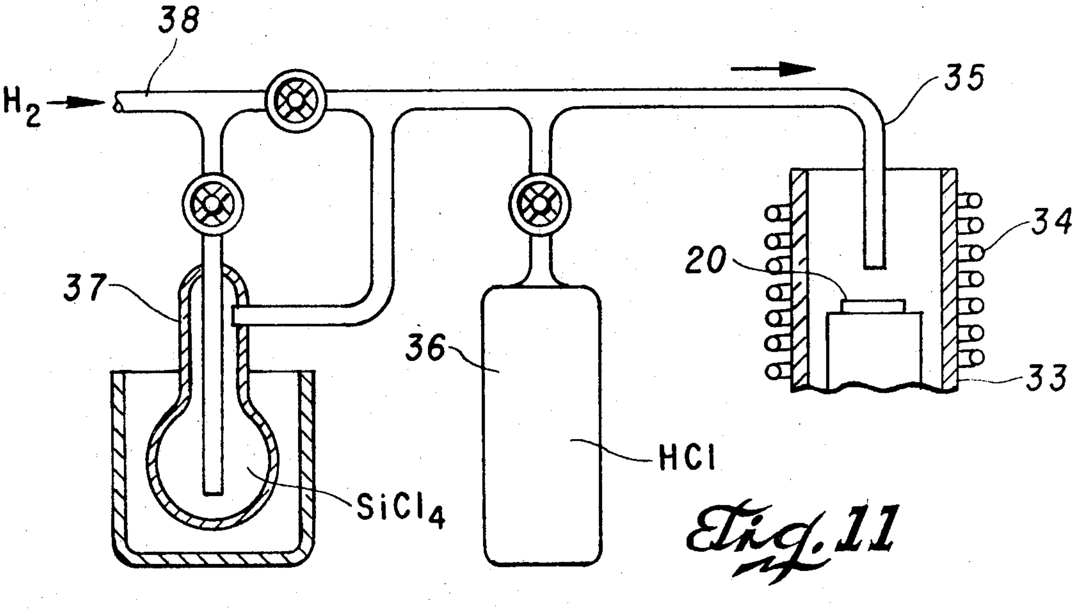

FIG. 11 is a front elevation, partly in section, of one form of apparatus used in the process of this invention;

Referring now to FIG. 1, there is now described the first step in the method of this invention. A slice of single-crystal high conductivity P+ type semiconductor material, such as silicon, having a resistivity of perhaps 0.010 to 0.025 Ω cm is used as the starting material. This slice may be about 1 inch in diameter and 10 mils thick. A small segment of the slice may be represented as a chip or wafer 10, which represents the segment occupied by one integrated circuit. Actually, the slice would contain dozens or even hundreds of segments such as the wafer 10.

A layer 3 of the N-type semiconductor material is epitaxially deposited on the surface 2 of the substrate such that it completely covers said surface.

Figure 2:
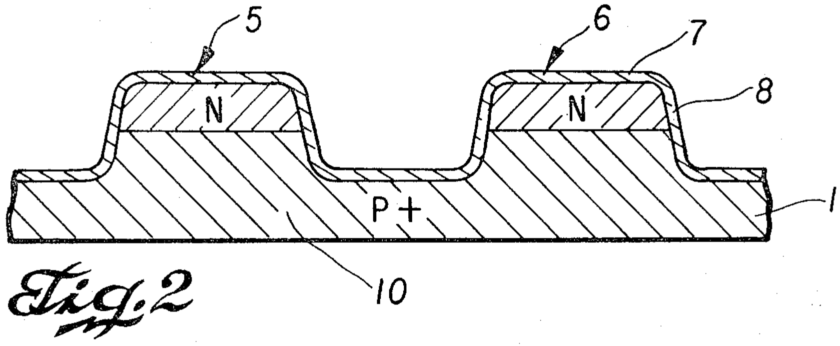

The surface 4 of the wafer 10 is covered with a suitable masking layer, preferably of the photoresist type, and the mask selectively removed. The mask and exposed portions of the surface 4 are then subjected to an etching condition which removes the exposed semiconductor material surrounding the mesas 5 and 6. Then the top surface of the slice is covered with an insulating coating 7, silicon oxide for example, which may be formed by any convention technique to a thickness of perhaps 10,000 A as illustrated in FIG. 2. For instance, the coating 7 may be thermally grown by exposing the slice to steam at about 1200° C.

The top surface 8 of the insulating coating 7 is then cleaned to remove all traces or organics and other contaminants from its surface and the slice is placed in a reactor to produce the top layer 9 which eventually becomes the substrate.

Figure 3:
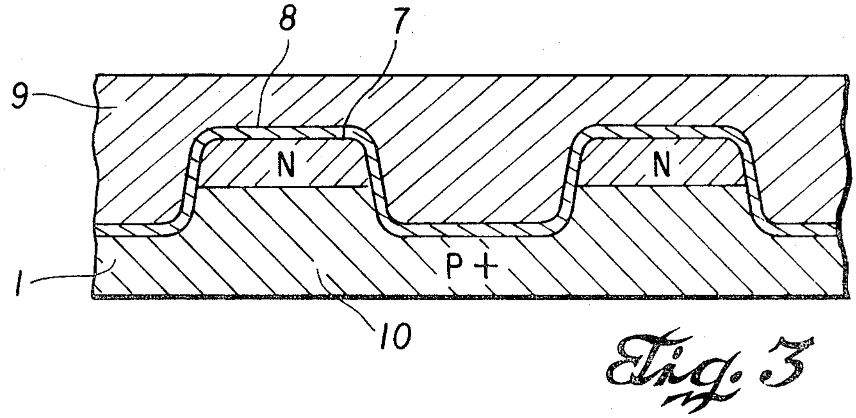

Within the reactor layer 9 of semiconductor material is vapor deposited over the top surface 8 of the slice 10 as seen in FIG. 3. The most common method of vapor deposition is by the hydrogen reduction of silicon tetrachloride, a technique well known in the art requiring no elaboration here. The conductivity type of layer 9 is not critical as it may be N-type, P-type intrinsic, or polycrystalline for layer 9 is effectively insulated from the semiconductor pockets by the silicon oxide layer 7. The thickness of the layer should be perhaps 7 or 8 mils or more to facilitate handling the unit without breakage.

Although one method of depositing layer 9 has been described, this is by no means restrictive, as other methods well known in the art for depositing semiconductor material may be used in the process of this invention.

Figure 4:
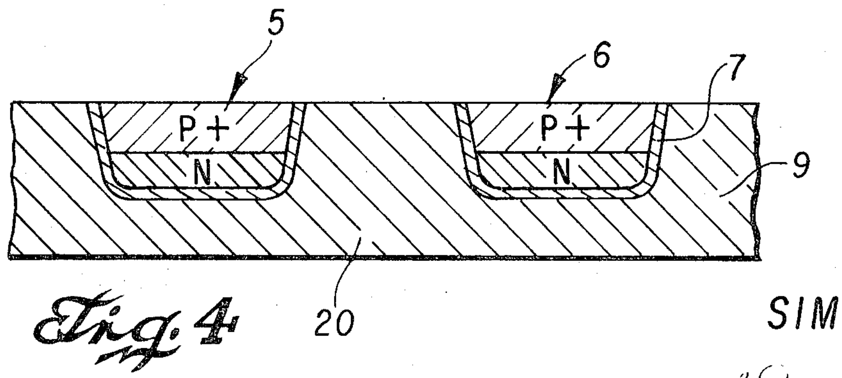

As the next step in the process of this invention the structure as shown in FIG. 3 is subjected to a lapping and polishing treatment on its lower face to remove substantially all of the original P+ material except that portion remaining within the mesas which now become isolated pockets 5 and 6. Wafer 20 is now inverted as illustrated in FIG. 4.

It is to be noted, as a particular aspect of this invention, that the degree of lapping is not critical. Since the dimensions of the P+ and N layers within the pockets 5 and 6 do not seriously affect the operating parameters of the devices subsequently to be formed within these areas, there is no requirement for precise lapping. Each of the N and P+ monocrystalline pockets 5 and 6 is insulated from the others and from the substrate or layer 9 by the silicon oxide layer 7. Oxide coating 7 is not shown to scale in the drawings, and would actually be perhaps an order to of magnitude thinner in proportion than is shown in the sectional views of the drawings.

Figures 5, 6, 7, 8:
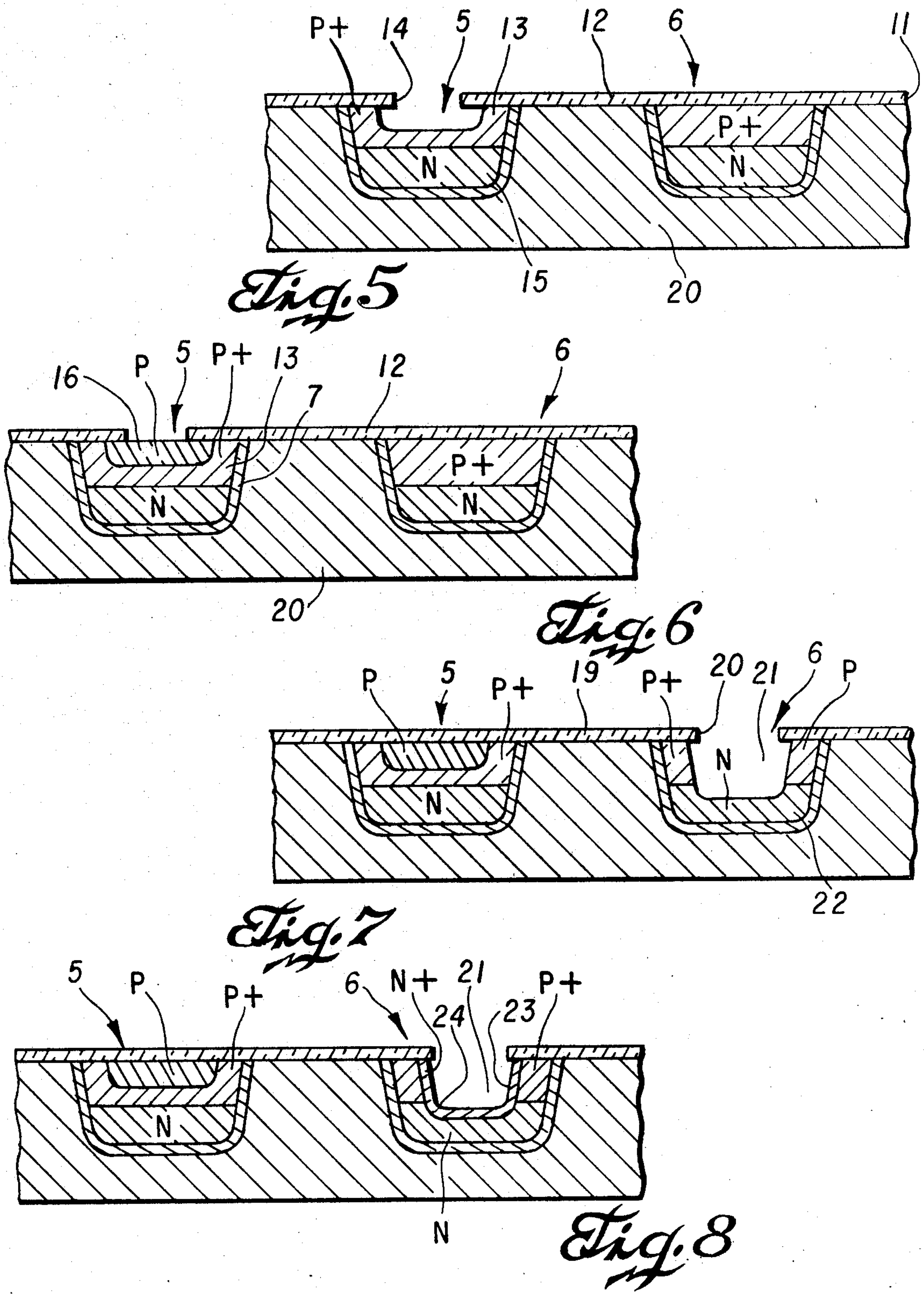

An oxide layer 12 is formed upon the upper surface 11 of the wafer 20 as depicted in FIG. 5. An alternative method to the steam method previously described for forming the oxide layer 12, would be the "oxidative" technique, by which oxygen and tetraethoxysilane are reacted in vapor form at 250J—500° C. The reaction mixture is obtained by bubbling oxygen through liquid tetraethoxysilane at room temperature, then combining the gaseous mixture with excess oxygen and passing it into a furnace tube containing the wafer 20 where the oxidation takes place. The silicon oxide thereby produced is deposited upon surface 11. A typical reaction condition for the oxidative method involves, by way of example, a flow rate of 1 cubic foot of oxygen per hour into the liquid tetraethoxysilane. The reaction mixture is then mixed with excess oxygen, also at a rate of 1 cubic foot per hour, and passed into the tube. At 500° C. in a 2-inch diameter quartz furnace tube, excellent deposits of silicon oxide are formed at rates from 1300—1400 A per hour. The advantages of this process is the relatively low temperatures at which uniform oxide coatings can be formed.

Through the use of photographic masking and etching techniques, for example, a select portion of the oxide layer 12 is removed so as to expose a corresponding portion of the high conductivity semiconductor P+ type region 13 within the aperture or window 14. This oxide removal may be accomplished by covering the oxide layer 12 with photoresist, exposing and developing the photoresist, and etching away the unmasked areas of the oxide. By this method, the oxide mask 12 shown in section in FIG. 5 is produced directly on the substrate surface 11. The mask thus produced will limit the area of the substrate that is to be affected by the subsequent vapor etch and epitaxial redeposition steps.

As the next step in the process of the present invention the wafer 20 is subjected to a selective vapor etch which removes a selected portion of the high conductivity P+ region 13, leaving the N-type region 15 intact as shown in FIG. 5. The wafer 20 is thereafter subjected to an epitaxial deposition step whereby, as shown in FIG. 6, the region 16 of low conductivity P-type semiconducting material is redeposited within the cavity produced by the vapor etch step as previously described, thus forming, for example, the collector region of a transistor. The remainder of the P+ type substrate 13 within the insulating layer of oxide 7 will form a high conductivity collector path to the surface of the subsequently formed transistor.

As shown in FIG. 7, the isolated pocket 5 is now masked with an oxide layer 19 and an aperture 20 is formed above the pocket 6 using standard photoresist and etch techniques. The cavity 21 is now formed by selectively etching through the aperture 20 such that the cavity 21 penetrates into the lower N-type region 22.

The high conductivity N+ region 23 is now epitaxially deposited on the surface 24 of the cavity 21 as illustrated in FIG. 8 such that a layer of N+ material is deposited which is adjacent the subsequently formed collector region and which extends to the surface, thereby furnishing a low resistance collector path to the surface of the wafer. It will be noted at this point that it is necessary to grow N+ material on the P+ sidewalls of the cavity 21, contrary to the stated objectives, but this will be seen to be of little consequence when the actual dimensions of the cavity are taken into account. Specifically, the depth of the cavity 21 is perhaps 1 mil or less while its width is 5 or 10 mils, the FIGS. being expanded in the vertical direction for clarity. Thus the vertical path is much shorter than the horizontal path for current flow and can be ignored.

Figure 9:
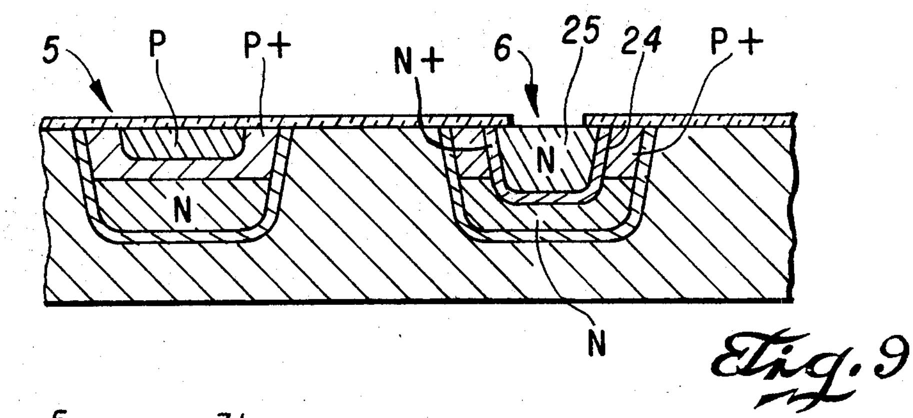

Finally, as shown in FIG. 9, the N-type collector region 25 is redeposited in the remaining portion of the cavity 21 adjacent the low resistivity N+ region 24.

Figure 10:
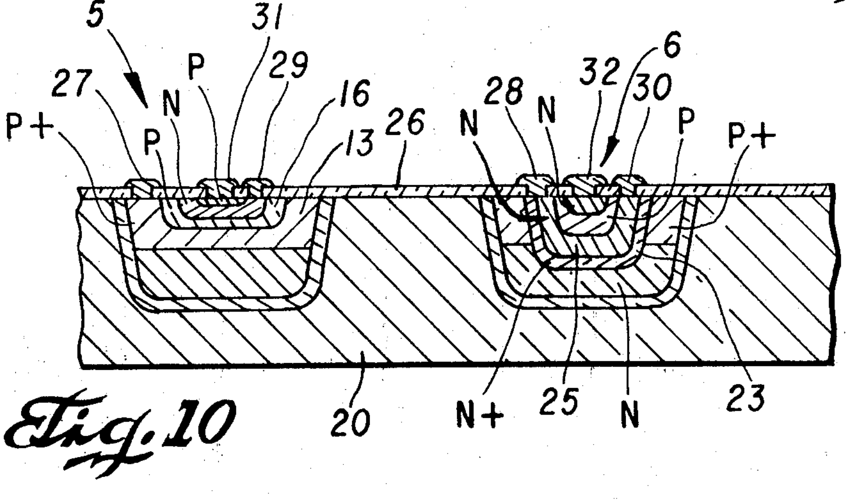

At this stage both pockets 5 and 6 are ready for the subsequent diffusion steps necessary to form the base and emitter regions as shown in FIG. 10. Pocket 5 will form a PNP transistor while pocket 6 will form a NPN transistor.

The final step is illustrated in FIG. 10. The oxide insulating layer 26 has apertures through which the metallic collector contracts 27 and 28 are made to the collector regions 16 and 25 through the low resistivity paths 13 and 23 respectively. Metallic base contacts 29 and 30 make contact to the base regions; and metallic emitter contact 31 and 32 form contacts to be the emitter regions.

In practicing the invention, various desired arrangements may be utilized as well as various techniques applied in order to accomplish the steps of vapor etching and epitaxial redepositing within the unmasked regions. In particular, however, it is desirable to use a process which brings the transformation from an etching condition to a depositing condition as smoothly as possible and with a minimum of cost. In line with this objective, the wafer 20 is placed within a reactor whose reactor constituents, during etching, are substantially the same as those during the epitaxial deposition. The basic formula for this operation is $SiCl_4 + 2H_2 \underset{\rightarrow}{\Delta} 4HC1 + Si$. This reaction is forced to the left by the addition of an excess of HC1, thus creating an etching condition. To change from an etching condition to one of deposition, (i.e., when the reaction proceeds to the right) merely calls for the termination of the HC1 flow which, in turn, brings about a gradual change from an etching condition to one of deposition.

Referring to FIG. 11, apparatus for etching and redepositing in accordance with this process comprises a reactor in the form of a tube 29 having heating coils 26. The furnace may be of horizontal or vertical type, may be suited for single or multiple slices, and may be either resistively or inductively heated. The silicon wafer including the wafer 20 are disposed within the furnace in such a position as to expose the slices to gases directed into the tube through a conduit 30. The hydrogen chloride and the silicon tetrachloride vapor are respectively introduced into the conduit 30 from a cylinder 27 containing anhydrous hydrogen chloride and from flask 28 containing liquid silicon tetrachloride, through which hydrogen gas is bubbled. The vapor pressure of the silicon tetrachloride is controlled by submerging the flask 28 in an ice bath. Purified dried hydrogen enters end 31 of the conduit. The flow of the gases into the tube furnace is regulated by conventional valves.

With the valves adjusted so that an excess of hydrogen chloride vapor is introduced into the reactor, the wafer 20 will be subjected to a selective vapor etch. While the oxide mask 12 will be substantially unaffected, select portions of the high conductivity P+ substrate region 13 is removed as shown in FIG. 5. The etchant itself will comprise a mixture of silicon tetrachloride, hydrogen chloride, and hydrogen. Alternatively, the valve controlling the flow of silicon tetrachloride may be closed, and an etchant comprising hydrogen chloride and hydrogen may successfully be used to remove the silicon substrate. The rate of etching as well as the dimension of the etched regions will be determined largely by the configuration and size of the oxide mask 12. Other factors that will affect the rate of etching are the temperature at which the reactor is maintained, the flow rate through the conduit 30, and the percentage composition of the etchant.

After the desired amount of the high conductivity silicon has been removed from the wafer by the above-described process, the valves are closed to terminate the flow of hydrogen chloride, the gas flow through the conduit 30 then consisting of hydrogen and silicon tetrachloride. Doping impurities may be introduced into the gas stream by placing an appropriate impurity-containing compound, such as a halide of boron, into the flask 28 or in a similar flask if a different temperature is required. With this arrangement, and due to the hydrogen reduction of the silicon tetrachloride, lightly doped P-type silicon is deposited upon the slice 20 within the aperture 14 and grows epitaxially upon the P+ silicon region 13. The deposition will continue until the region 16 of the lightly doped P-type silicon is formed within the vacant area previously produced by the vapor etch step and adjacent the P+ type region 13 as shown in FIG. 6.

Although a particular method and particular materials have been described in selectively removing the P+ high conductivity substrate material and epitaxially redepositing the P-type material, any variations of the materials or the techniques may be utilized as long as the broad concept of selective vapor etch and epitaxial redeposition is employed. Using this concept close control may be maintained over the dimensions and configurations of the N and P type regions. In addition, it is to be observed from FIG. 10 that contact may be made to the P+ type layer 13 at the surface of the wafer 20 by cutting through the oxide layer 26 without the necessity of a subsequent diffusion step to reach these regions. As mentioned previously, the P+ type layer 13 allows better high conductivity contact to be made to the underside of the P-type region 16 which serves as one of the active regions of a component in an integrated circuit, for instance the collector region of a transistor.

The versatility and utility of the process of this invention, and in particular the selective vapor etch and epitaxial redeposition steps, allow the fabrication of these discrete circuit components within a single wafer and yet allow them to e be electrically isolated from each other.

Although specific integrated circuit structures have thus been described, it is obvious that using the method of this invention a multitude of configurations of circuit components may be formed within one substrate. The dimensions of the active regions of the various circuit component may be closely controlled by the combination of the vapor etch and epitaxial redeposition, thus increasing the reliability of the device.

While the invention has been described with reference to specific methods and embodiments, it is to be understood that this description is not to be construed in a limiting sense. As an example, the specific embodiments were described beginning an N-type semiconductor layer deposited adjacent a P+ type semiconductor substrate, thus dictating the polarity of subsequently formed semiconductor regions. An N+ type semiconductor substrate could have as easily been used with all later formed regions of reversed polarity from the specific embodiment described. Various modifications of the disclosed embodiments, as well as other embodiments of the invention, may become apparent to persons skilled in the art without departing from the spirit and scope of the invention as defined by the appended claims.

I claim:

1. A semiconductor device containing complementary transistors comprising;

a. a substrate of a semiconductor material having a plurality of pockets formed in a surface thereof;

b. an insulating layer formed in each of said pockets;

c. a low conductivity semiconductor layer of a first conductivity type formed in the bottom of each of said pockets adjacent said insulating layer;

d. a high conductivity semiconductor layer of opposite conductivity type with respect to said low conductivity layer formed in said pockets adjacent said low conductivity layer and extending to said surface;

e. a first plurality of semiconductor layers forming a first transistor formed in said high conductivity layer in one of said pockets;

f. a plurality of high conductivity semiconductor material regions of conductivity type opposite said high conductivity layer formed in the other pocket and extending to said surface;

g. a second plurality of semiconductor layers forming a second transistor complementary to said first transistor, formed adjacent said high conductivity regions in said other pocket; and h. ohmic contacts to said semiconductor layers forming said first and second transistors at said surface, including collector contacts to said high conductivity layer and to said high conductivity regions, respectively.

2. A semiconductor device as defined by claim 1 wherein said semiconductor is silicon.

3. A semiconductor device as defined by claim 1 wherein said first plurality of semiconductor layers are of PNP conductivity and said second plurality of semiconductor layers are of NPN conductivity.